(12) United States Patent
Fukuda

(10) Patent No.: US 7,550,817 B2
(45) Date of Patent: Jun. 23, 2009

(54) SEMICONDUCTOR DEVICE HAVING FUSE WITH PROTECTION CAPACITOR

(75) Inventor: Yasuhiro Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/082,918

(22) Filed: Mar. 18, 2005

(65) Prior Publication Data

US 2006/0054993 A1    Mar. 16, 2006

(30) Foreign Application Priority Data

Sep. 13, 2004  (JP)  ............... 2004-264871

(51) Int. Cl.
*H01L 29/00*    (2006.01)
(52) U.S. Cl. ............... 257/529; 257/209
(58) Field of Classification Search ............... 257/529, 257/209
See application file for complete search history.

(56) References Cited

U.S. PATENT DOCUMENTS

| | | | | | |
|---|---|---|---|---|---|
| 4,837,520 | A | * | 6/1989 | Golke et al. | ............... 324/550 |
| 5,675,174 | A | * | 10/1997 | Nakajima et al. | ............ 257/529 |
| 6,180,993 | B1 | * | 1/2001 | Wang et al. | ................ 257/529 |

FOREIGN PATENT DOCUMENTS

| | | |
|---|---|---|
| JP | 11-67054 | 3/1999 |
| JP | 3526853 | 2/2004 |

* cited by examiner

*Primary Examiner*—Long Pham
(74) *Attorney, Agent, or Firm*—Rabin & Berdo, P.C.

(57) ABSTRACT

A semiconductor device has a fuse, an internal circuit and a protection capacitor. The fuse has a first terminal connected to be applied to a fixed voltage and a second terminal. The internal circuit includes a transistor. The transistor has a threshold voltage and a gate. The protection capacitor is connected between the second terminal of the fuse and the gate of the transistor. The protection capacitor supplies the threshold voltage to the transistor where the fuse supplies the fixed voltage to the protection capacitor.

16 Claims, 4 Drawing Sheets

SEMICONDUCTOR DEVICE HAVING FUSE WITH PROTECTION CAPACITOR

BACKGROUND OF THE INVENTION

The present invention relates to a semiconductor device, and particularly to a semiconductor device having fuses for modifying electrical failures of the semiconductor device.

It is difficult to find electric failures or detective conditions generated in a manufacturing process of a semiconductor device (LSI) such as a memory during its manufacturing process. They become clear in an electric testing process executed after the manufacturing process. Therefore, the LSI is provided with at least one redundant fuse to modify the electric failures. The electric failures found out in the electric testing process can be modified by cutting and processing (fuse blow) the fuse with laser light.

The redundant fuse is formed, using a polysilicon layer, on a field insulating film formed on the surface of a semiconductor substrate and is covered with an insulating film as shown in, for example, a patent document 1 (Japanese Unexamined Patent Publication No. Hei 11(1999)-67054). Upon cutting of the fuse, it is cut by laser light together with the insulating film. Thus, a cut section of the fuse is exposed to the outside within a fuse aperture or opening during from after the cutting of the fuse to resin encapsulation.

In a scribing process executed during from after the cutting of the fuse to the resin encapsulation, the cut section of the fuse is subjected to charged water. When ESD (Electro Static Discharge) occurs in this state, there is a possibility that an electrical charge will pass from the charged water to the fuse cut section and a gate electrode of an internal transistor to thereby cause breakdown of a gate insulating film of the internal transistor. There is also a possibility that even by an electrical charge charged on a film with a chip mounted thereon, it will be discharged from the fuse cut section to the gate electrode of the internal transistor, thereby causing the breakdown of the gate insulating film.

A protection circuit that protects an internal circuit of a semiconductor device has been described in, for example, a patent document 2 (Japanese Patent Application No. 3526853). This internal circuit is connected to a ground potential terminal (high potential side) and a low voltage source terminal (low potential side) and operated at a negative potential. The protection circuit comprises a first diode connected between a ground voltage source terminal and an input terminal and operated in the backward direction where a negative polarity surge has occurred in the input terminal, a second diode connected between the input terminal and the low potential source terminal and operated in the forward direction where the negative polarity surge has occurred in the input terminal, an NMOS transistor connected between a substrate potential terminal and the low voltage source terminal, and first and second capacitors which divide the difference in potential between the substrate potential terminal and the low voltage source terminal and applies a source-to-gate voltage to the NMOS transistor. The respective capacitances of the first and second capacitors are selected in such a manner that the source-to-gate voltage of the NMOS transistor does not cause turning-on thereof over its threshold value in the normal case free of the electrostatic surge. Since a backward electrostatic surge current flows in the first diode where the negative polarity surge is intruded into the input terminal, a response time is taken and the electrostatic surge responds in the forward direction of the second diode, so that the electrostatic surge current flows from the second diode to the input terminal. The difference in potential between the substrate potential terminal and the low voltage source terminal becomes approximately identical to the voltage of the electrostatic surge. Thus, the gate-to-source voltage of the NMOS transistor, which is divided by the first and second capacitors, exceeds the threshold value so that the NMOS transistor is turned ON. Therefore, the electrostatic surge current flows through the substrate potential terminal, the NMOS transistor and the second diode so that the internal circuit is protected from the electrostatic surge.

As described above, the redundant fuse of the semiconductor device has the cut section exposed to the outside in the scribing process or the like subsequent to having been cut by, for example, laser. Therefore, there is a fear that the gate insulating film of the transistor of the internal circuit will be broken due to the electrical charge intruded from the cut section. Although, however, measures against the ESD surge intruded from the input terminal such as described in the patent document 2 have heretofore been taken, any measures are not taken against the ESD surge at the cut section of the redundant fuse.

SUMMARY OF THE INVENTION

The present invention is directed to a semiconductor device having a fuse and a protection capacitor. According to the aspect of the present invention, a semiconductor device has a fuse, an internal circuit and a protection capacitor. The fuse has a first terminal connected to be applied to a fixed voltage and a second terminal. The internal circuit includes a transistor. The transistor has a threshold voltage and a gate. The protection capacitor is connected between the second terminal of the fuse and the gate of the transistor. The protection capacitor supplies the threshold voltage to the transistor where the fuse supplies the fixed voltage to the protection capacitor.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

First Preferred Embodiment

Figure 1:
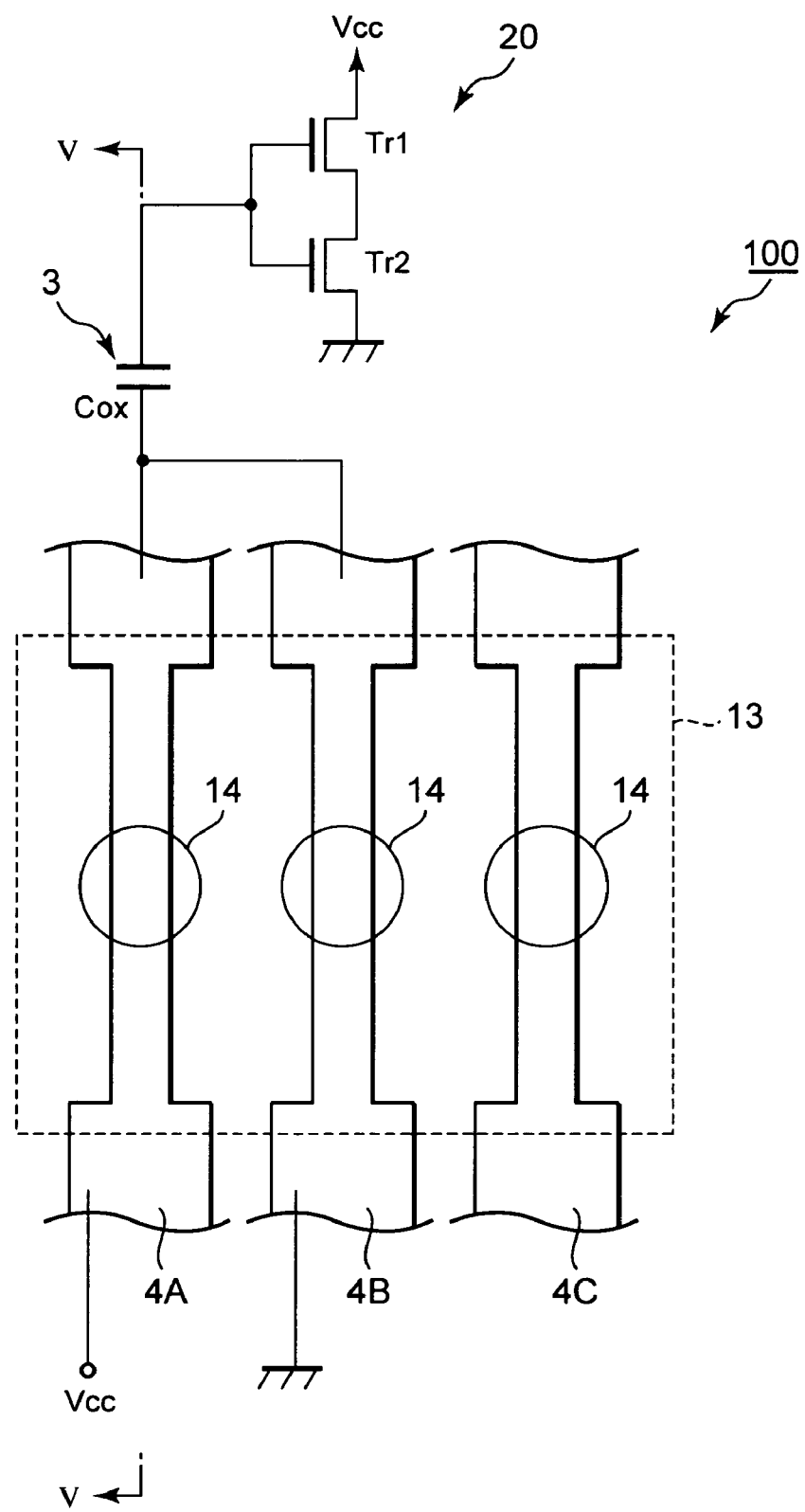
FIG. 1 is a plan view showing the neighborhood of redundant fuses of a semiconductor device 100 according to the present invention.
Figure 6:
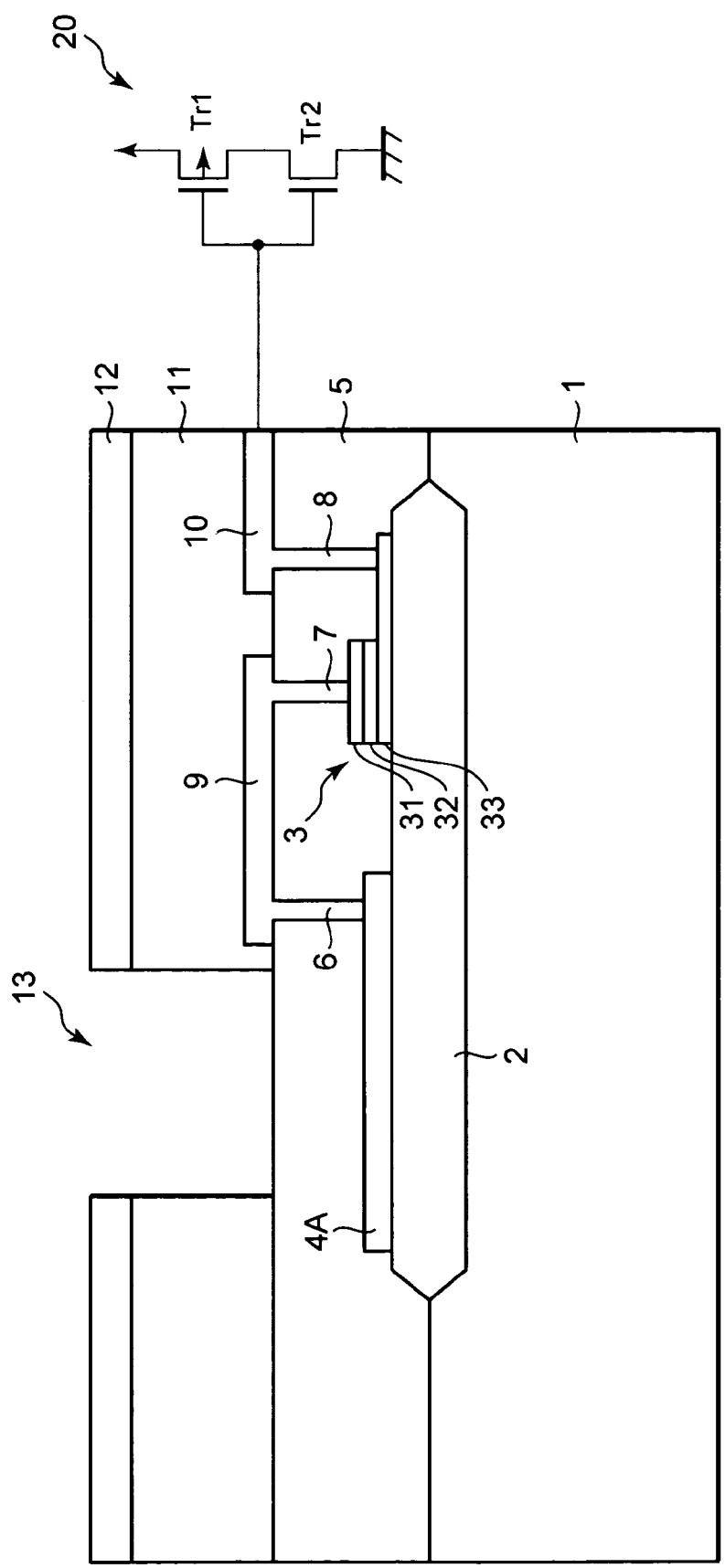
FIG. 6 is a plan view taken along line V-V of FIG. 1.

FIG. 1 is a plan view showing the neighborhood of redundant fuses of a semiconductor device 100 according to the first embodiment. FIG. 6 is a cross-sectional view taken along line V-V of FIG. 1.

The semiconductor device 100 comprises a P-type semiconductor substrate 1, a field insulating film 2, fuses 4A through 4C, a capacitor 3, an insulating film 5, first layer wiring films 9 and 10, an insulating film 11 and a protection film 12. In the present embodiment, the fuses 4A and 4B will be explained by way of example.

The P type semiconductor substrate 1 is of a substrate added with P and As corresponding to P-type impurities. The semiconductor substrate 1 is placed on a stage in a state of a wafer and identical in potential to the stage. Although the semiconductor substrate 1 is placed on the stage with a film interposed therebetween in a scribing process to be described later, it is identical in potential to the stage because the film is very thin and the capacitance between the wafer and the stage is very large. The field insulating film 2 is of an insulating film such as an oxide film formed in a predetermined region of the P-type semiconductor substrate 1 by LOCOS, STI or the like.

Figure 2:
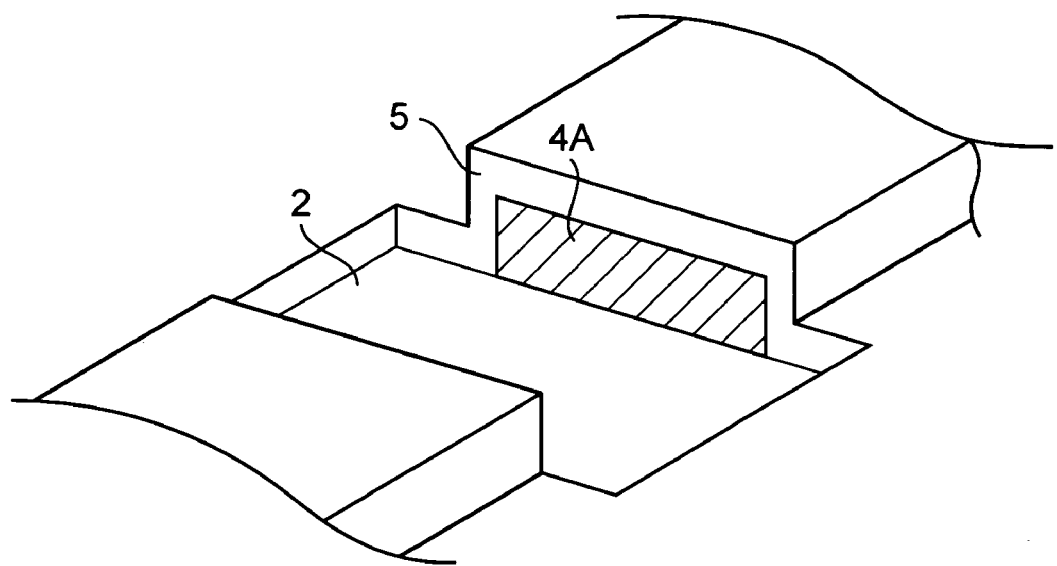
FIG. 2 is a perspective view illustrating a cut section of the fuse shown in FIG. 1.

The fuses 4A and 4B are formed in a predetermined region on the filed insulating film 2. The fuse 4A is formed of a polysilicon film or a multilayer film of polysilicon and high melting point silicide (eutectic film of a high melting point metal such as tungsten, molybdenum, titanium or the like, and silicon) by a sputtering method. The fuses 4A and 4B are respectively electrically connected to gate terminals of transistors Tr1 and Tr2 of an internal circuit via the first layer wiring film 9, the capacitor 3 and the first layer wiring film 10 to be described later. The transistors Tr1 and Tr2 are of a P-type transistor and an N-type transistor respectively and constitute a detection circuit 20 which detects the states of the fuses 4A and 4B. The fuses 4A and 4B are of redundant fuses for modifying electric failures or defective conditions of the semiconductor device 100. Depending on the electric failures or defective conditions of the semiconductor device 100, they are cut and processed (fuse-blown) at trimming points of FIG. 1 by a laser beam together with the insulating film 5. FIG. 2 shows a cut section of the laser-blown fuse 4A. As shown in the same figure, the fuse 4A and the insulating film 5 are cut by the laser blow, so that the field insulating film 5 is exposed at a point where the insulating film 5 has been removed.

The capacitor 3 is formed on the field insulating film 2 and constitutes an ESD protection circuit for the fuses 4A through 4C. The capacitor 3 comprises a first electrode 31, a capacitance insulating film 32 and a second electrode 33. Each of the first electrode 31 and the second electrode 33 is formed of a metal such as tungsten, aluminum, an alloy film (Al alloy film) composed principally of aluminum, or polysilicon, or a multilayer film of polysilicon and high melting point silicide (eutectic film of a high melting point metal such as tungsten, molybdenum, titanium or the like, and silicon). The capacitance insulating film 32 is formed of an oxide film such as $SiO_2$ or other insulating film.

The insulating film 5 is formed on the semiconductor substrate 1 so as to cover the fuses 4A and 4B and the capacitor 3. The insulating film 5 is of a BPSG film ($SiO_2$ film doped with phosphorus or boron) or a multilayer film of both $SiO_2$ film and BPSG film, which is formed by a CVD method using, for example, $SiH_4$ gas. An aperture 6 for exposing parts of the fuses 4A and 4B, an aperture 7 for exposing the first electrode 31 of the capacitor 3, and an aperture 8 for exposing the second electrode 33 of the capacitor 3 are defined in the insulating film 5.

The first layer wiring film 9 is formed on the insulating film 5. The first layer wiring film 9 is embedded even into the apertures 6 and 7 and connected to the fuses 4A and 4B through the aperture 6. Also the first layer wiring film 9 is connected to the first electrode 31 through the aperture 7. The first layer wiring film 10 is formed on the insulating film 5. The first layer wiring film 10 is embedded even into the aperture 8 and connected to the second electrode 33 through the aperture 8. Also the first layer wiring film 10 is electrically connected even to the gate terminals of the transistors Tr1 and Tr2 of the detection circuit 20.

The insulating film 11 and the protection film 12 are formed over the insulating film 5 so as to cover the first layer wiring films 9 and 10. An aperture 13 for opening the upper portions of the fuses 4A through 4C is defined in the insulating film 11 and the protection film 12.

Figure 3:
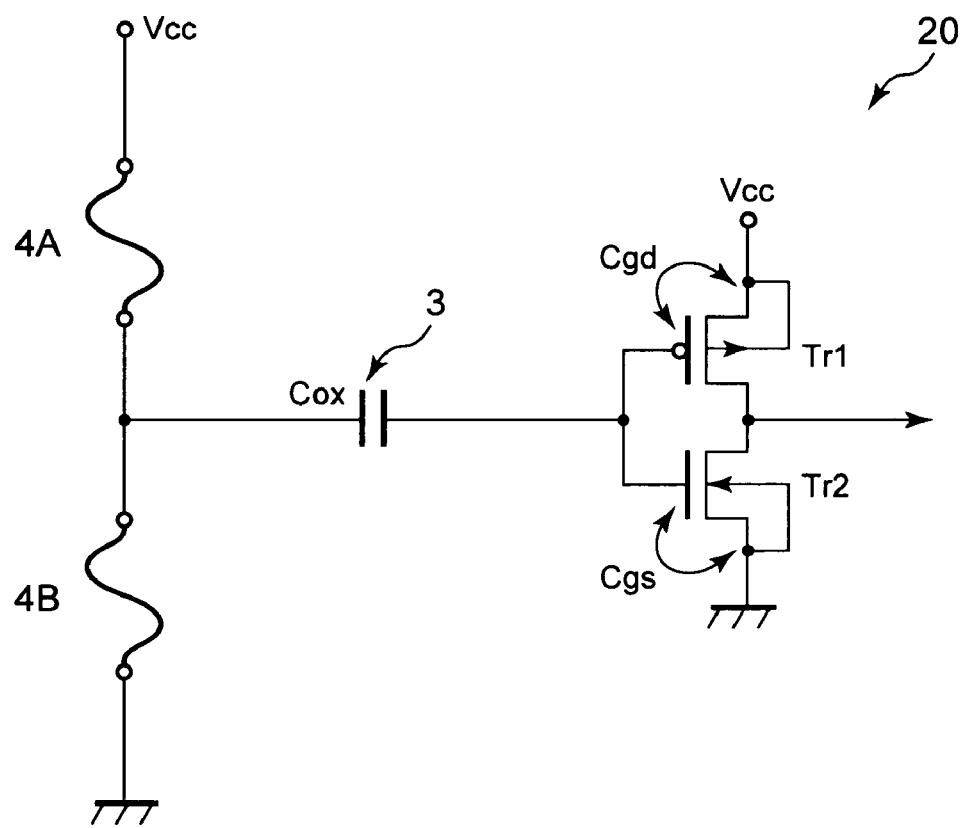
FIG. 3 is an electric circuit diagram showing a relationship of connection between a capacitor and a detection circuit.
Figure 4:
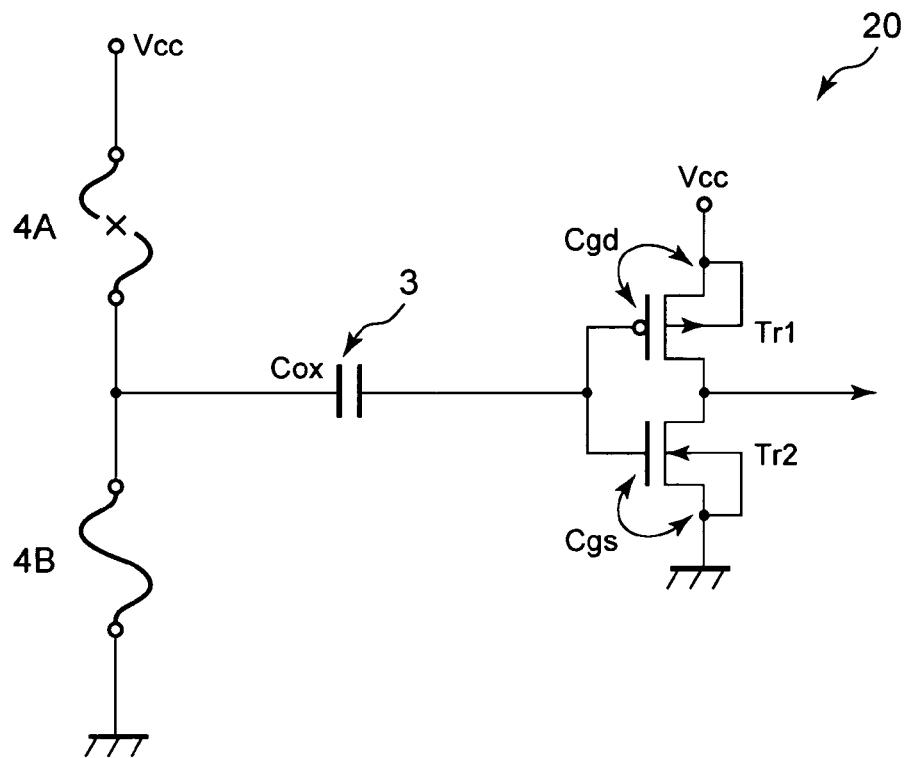
FIG. 4 is an electric circuit diagram illustrating a state in which the fuse 4A is being cut in FIG. 3.

FIG. 3 is an electric circuit diagram showing a relationship of connections among the fuses, capacitor and detection circuit employed in the semiconductor device according to the present embodiment. FIG. 4 is an electric circuit diagram showing a state in which the fuse has been cut in FIG. 3.

In FIG. 3, Cox indicates the capacitance of the capacitor 3, Cgd indicates a gate-to-drain capacitance of the transistor Tr1, and Cgs indicates a gate-to-source capacitance of the transistor Tr2.

As shown in FIG. 4, in a state in which the fuse 4A is being cut and the fuse 4B is being non-cut, Cgd is connected to a source potential Vcc, and Cgs and Cox are connected in parallel with Cgd. A voltage obtained by dividing the source potential Vcc with both the combined capacitance of Cgs and Cox connected in parallel and Cgd is applied to the gate terminals of the transistors Tr1 and Tr2.

Figure 5:
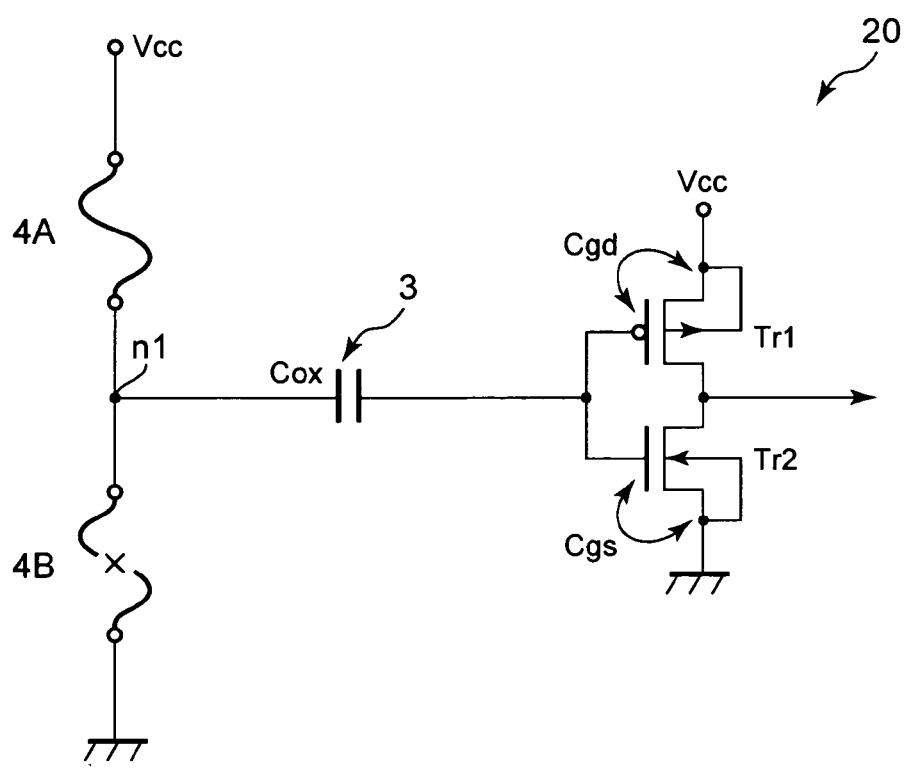
FIG. 5 is an electric circuit diagram showing a state in which the fuse 4B is being cut in FIG. 3.

As shown in FIG. 5, in a state in which the fuse 4A is being non-cut and the fuse 4B is being cut, Cox and Cgd are connected in parallel with the source potential Vcc, and Cox and Cgd are connected to a substrate potential through Cgs. A voltage obtained by dividing the source potential Vcc with Cox and Cgd connected in parallel, the combined capacitance of Cox and Cgd, and Cgs is applied to the gate terminals of the transistors Tr1 and Tr2.

The capacitance Cox of the capacitor 3 is selected in such a manner that the voltage applied to the gate terminals of the transistors Tr1 and Tr2 gets closer to the substrate potential in the state in which the fuse 4A is being cut and the fuse 4B is being non-cut. Further, the capacitance Cox thereof is selected in such a manner that the voltage applied to the gate terminals of the transistors Tr1 and Tr2 gets closer to the source potential Vcc in the state in which the fuse 4A is being non-cut and the fuse 4B is being cut. In other words, the capacitance Cox of the capacitor 3 is selected depending on the threshold voltages of the transistors Tr1 and Tr2 and Cgd and Cgs in such a manner that a gate-to-drain voltage of the transistor Tr1 exceeds its threshold voltage to turn it ON in the state in which the fuse 4A is being cut and the fuse 4B is being non-cut, and a gain-to-source voltage of the transistor Tr2 exceeds its threshold voltage to turn it ON in the state in which the fuse 4A is being non-cut and the fuse 4B is being cut.

In the semiconductor device 100 according to the present embodiment described above, the capacitor C is caused to absorb an electrical charge intruded from the cut section of the fuse even though an ESD surge occurs in the fuse cut section, thereby making it possible to prevent an excessive voltage from being generated at the gate terminals of the transistors Tr1 and Tr2 of the internal circuit and protect the gate insulating film of the internal transistors Tr1 and Tr2.

Described specifically, even if electrostatic charged water contacts the fuse cut section in the scribing process subsequent to the cutting of the fuse, some of electrical charges from the electrostatic charged water is accumulated in the capacitor 3. It is therefore possible to suppress a rise in gate terminal voltage of each of the transistors Tr1 and Tr2 of the internal circuit and protect the gate insulating film of each of the transistors Tr1 and Tr2. Even if electrical charges intrude into the fuse cut section from a charged film upon picking up a chip placed on the film after the scribing process, some of the electrical charges is accumulated in the capacitor 3. It is therefore possible to suppress a rise in the gate terminal voltage of each of the transistors Tr1 and Tr2 of the internal circuit and protect the gate insulating film of each of the transistors Tr2 and Tr2.

Although the above embodiment-has shown the example in which the capacitor C is connected to the gate terminals of the transistors Tr1 and Tr2 of the detection circuit 20, the capacitor C may be connected to drain terminals or the like of the transistors. The capacitor C may be connected to, for example, a drain terminal of a pull-up transistor whose source terminal is connected to a source potential and whose gate terminal is connected to a substrate potential. Even in this case, there is a fear that when a fuse is directly connected to the drain terminal of the pull-up transistor, an excessive voltage is generated between the gate and source thereof, so that the gate insulating film will break down. However, the fuse and the drain terminal of the transistor are connected via the capacitor to thereby make it possible to protect the gate insulating film.

What is claimed is:

1. A semiconductor device comprising:
    a semiconductor substrate having a surface thereof;
    a first insulating layer selectively formed on the surface of the semiconductor substrate;
    a fuse formed on the first insulating layer, the fuse having a first terminal and a second terminal;
    a protection capacitor formed on the first insulating layer, the protection capacitor; having a third terminal electrically connected to the second terminal of the fuse and a fourth terminal;
    a second insulating layer formed on the fuse and the protection capacitor;
    a third insulating layer formed on the second insulating layer, the third insulating layer having a window for exposing the second insulating layer over the fuse; and
    an internal circuit including a transistor having a gate electrically connected to the fourth terminal of the protection capacitor.

2. The semiconductor device according to claim 1, wherein the fuse is formed of polysilicon.

3. The semiconductor device according to claim 1, wherein a fixed voltage is applied to the first terminal of the fuse.

4. The semiconductor device according to claim 3, wherein the fixed voltage is a power supply voltage.

5. The semiconductor device according to claim 3, wherein the fixed voltage is a ground voltage.

6. The semiconductor device according to claim 1, wherein the protection capacitor includes a lower electrode film formed on the first insulating layer, a dielectric film formed on the lower electrode layer and an upper electrode film formed on the dielectric film.

7. The semiconductor device according to claim 1, wherein the transistor has a threshold voltage and the protection capacitor supplies the threshold voltage to the transistor where the fuse supplies the fixed voltage to the protection capacitor.

8. The semiconductor device according to claim 1, wherein the first insulating layer is an element isolation region.

9. The semiconductor device according to claim 1, wherein the first insulating layer is a field insulating film.

10. The semiconductor device according to claim 1, further comprising a first wiring formed on the first insulating layer, one end of the first wiring being electrically connected to the second terminal of the fuse, and the other end of the first wiring being electrically connected to the third terminal of the protection capacitor.

11. A semiconductor device comprising:
    a first fuse having a first terminal connected to a first fixed voltage and a second terminal;
    a second fuse having a third terminal connected to a second fixed voltage and a fourth terminal connected to the second terminal of the first fuse;
    an internal circuit including a first transistor having a first gate thereof and a second transistor having a second gate thereof which is connected to the first gate; and
    a protection capacitor connected between the second terminal of the first fuse and the first gate, wherein the protection capacitor has a capacitance value such that a predetermined voltage is present at one of the first gate and the second gate in a case where one of the fuses supplies the first or second fixed voltage to the protection capacitor.

12. The semiconductor device according to claim 11, wherein the first fixed voltage is a power supply voltage and the second fixed voltage is a ground voltage.

13. The semiconductor device according to claim 12, wherein the first transistor is a p-type MOS transistor and the second transistor is an n-type MOS transistor.

14. The semiconductor device according to claim 13, wherein the protection capacitor has a capacitance such that a first threshold voltage is supplied to the first gate in a case where the second fuse supplies the ground voltage and a second threshold voltage is supplied to the second gate in a case where the fuse supplies the power supply voltage.

15. The semiconductor device according to claim 11, wherein one of the first and second fuses are cut when the semiconductor device operates.

16. The semiconductor device according to claim 11, wherein the internal circuit is an inverter.

* * * * *